US006894907B2

(12) United States Patent
Gustine et al.

(10) Patent No.: US 6,894,907 B2
(45) Date of Patent: May 17, 2005

(54) CLAMPING CASE

(75) Inventors: Gary Gustine, Bonham, TX (US);
Charles Ham, Mound, MN (US);
Matthew Kusz, Minneapolis, MN (US);
Michael Sawyer, Madison, TN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 73 days.

(21) Appl. No.: 09/918,989

(22) Filed: Jul. 31, 2001

(65) Prior Publication Data

US 2003/0026082 A1 Feb. 6, 2003

(51) Int. Cl.⁷ .............................. H05K 7/14; H05K 7/18
(52) U.S. Cl. ...................... 361/801; 361/802; 361/756; 361/759; 361/796
(58) Field of Search ................................ 361/752–753, 361/754, 755, 756, 759, 796, 685, 801–802, 704, 741, 737, 758, 803

(56) References Cited

U.S. PATENT DOCUMENTS

| 2,737,579 A | 3/1956 | Wehrlin et al. |
| 2,796,559 A | 6/1957 | Feucht |
| 2,833,966 A | 5/1958 | Goodier et al. |
| 2,876,277 A | 3/1959 | Badger et al. |
| 3,087,095 A | 4/1963 | McConkey, Jr. et al. |

(Continued)

FOREIGN PATENT DOCUMENTS

| EP | 1 041 002 | 10/2000 |
| GB | 2 193 552 | 2/1988 |
| JP | 58-634 | 6/1981 |
| JP | 58-105187 | 7/1983 |
| JP | 60 79834 | 5/1985 |
| JP | 60-26936 | 2/1987 |
| JP | 62-67936 | 3/1987 |
| JP | 62-79404 | 4/1987 |
| JP | 2-4287 | 1/1990 |
| JP | 2-166798 | 6/1990 |
| JP | 7-177645 | 7/1995 |
| JP | 8-65868 | 3/1996 |

OTHER PUBLICATIONS

Gary Gustine et al., U.S. Appl. No. 09/804,129, "Mechanical Housing", filed Mar. 12, 2001.
Abacon Telecommunications, HDSL Low Capacity Repeater Case, 1 pg., date unknown.
Abacon Telecommunications, HDSL High Capacity Repeater Case, 2 pgs., date unknown.
"Hardened Telecom Enclosures for Optimal Thermal Management of Electronics", SPC TelEquip, pp. 1–20, Date Unknown.
Seri Lee, "How to Select a Heat Sink," Electronics Cooling, 9 pgs., Oct. 6, 2000.
Joe Ricke Sr., "Managing Heat in Electronic Enclosures," Electronic Packaging & Production, pp. 87–88, 90, 92, vol. 36, No. 2, Feb. 1996.
Circa Enterprises, Inc. "Digital Repeater Housings—HDSL Repeater", 2 pgs., 2000.
Circa Enterprises, Inc. "Digital Repeater Housings—T1 Repeater", 2 pgs., 2000.

Primary Examiner—Amir Zarabian
Assistant Examiner—Thanh Y. Tran
(74) Attorney, Agent, or Firm—Fogg and Associates, LLC; Laura A. Ryan

(57) ABSTRACT

In one embodiment, a case for confining at least one circuit card to a location within a housing is provided. The case has at least one slot that contains the circuit card. The case also has at least one actuator adapted to clamp the circuit card within the slot.

16 Claims, 17 Drawing Sheets

U.S. PATENT DOCUMENTS

| | | |
|---|---|---|
| 3,135,321 A | 6/1964 | Butt et al. |
| 3,366,171 A | 1/1968 | Scharli |
| 3,467,891 A | 9/1969 | Mogle |
| 3,487,267 A | 12/1969 | Winston et al. |
| 3,697,929 A | 10/1972 | Konewko et al. |
| 3,767,974 A | 10/1973 | Donovan, Jr. et al. |
| 3,809,798 A | 5/1974 | Simon |
| 3,997,819 A | 12/1976 | Eggert et al. |
| 4,172,212 A | 10/1979 | Heinzer |
| 4,184,539 A | 1/1980 | Rein |
| 4,259,843 A | 4/1981 | Kausch |
| 4,301,494 A | 11/1981 | Jordan |
| 4,449,576 A | 5/1984 | Baum et al. |
| 4,528,615 A * | 7/1985 | Perry .................. 361/722 |
| 4,547,833 A * | 10/1985 | Sharp .................. 361/716 |
| 4,559,790 A | 12/1985 | Houston |
| 4,564,061 A | 1/1986 | Rauth et al. |
| 4,656,559 A | 4/1987 | Fathi |
| 4,662,002 A | 4/1987 | Davis et al. |
| 4,679,250 A | 7/1987 | Davis et al. |
| 4,777,561 A | 10/1988 | Murphy et al. |
| 4,805,482 A | 2/1989 | Boda |
| 4,815,913 A | 3/1989 | Hata et al. |
| 4,849,858 A | 7/1989 | Grapes et al. |
| 4,858,068 A | 8/1989 | Bitller et al. |
| 4,858,070 A | 8/1989 | Buron et al. |
| 4,909,752 A | 3/1990 | Hallum et al. |
| 4,953,058 A | 8/1990 | Harris |
| 4,962,444 A | 10/1990 | Niggemann |
| 4,962,445 A | 10/1990 | Pelet et al. |
| 4,987,978 A | 1/1991 | Jungersen |
| 5,001,775 A * | 3/1991 | Hayashi et al. .......... 455/158.5 |
| 5,019,939 A | 5/1991 | Reimer |
| 5,045,971 A | 9/1991 | Ono et al. |
| 5,048,793 A | 9/1991 | Mefford et al. |
| 5,089,935 A | 2/1992 | Ito |
| 5,105,337 A | 4/1992 | Bitller et al. |
| 5,267,122 A | 11/1993 | Glover et al. |
| 5,309,315 A | 5/1994 | Naedel et al. |
| 5,329,425 A | 7/1994 | Leyssens et al. |
| 5,337,218 A | 8/1994 | Cipolla et al. |
| 5,398,164 A | 3/1995 | Goodman et al. |
| 5,424,916 A | 6/1995 | Martin |
| 5,432,682 A | 7/1995 | Giehl et al. |
| 5,519,573 A | 5/1996 | Cobb et al. |
| 5,642,264 A * | 6/1997 | Cantrell .................. 361/802 |
| 5,750,905 A * | 5/1998 | Weimer et al. .......... 73/863 |
| 5,757,580 A * | 5/1998 | Andress et al. .......... 360/97.02 |
| 5,822,196 A | 10/1998 | Hastings et al. |
| 5,825,621 A | 10/1998 | Giannatto et al. |
| 5,842,514 A | 12/1998 | Zapach et al. |
| 5,896,268 A | 4/1999 | Beavers |
| 5,914,854 A * | 6/1999 | Holt .................. 361/683 |
| 5,923,531 A | 7/1999 | Bachman et al. |
| 5,946,193 A | 8/1999 | Hendrix et al. |
| 5,969,901 A * | 10/1999 | Eckberg et al. .......... 360/97.01 |
| 5,995,378 A | 11/1999 | Farnworth et al. |
| 6,002,588 A | 12/1999 | Vos et al. |
| 6,038,129 A | 3/2000 | Falaki et al. |
| 6,045,140 A | 4/2000 | Morris, Jr. |
| 6,104,611 A | 8/2000 | Glover et al. |
| 6,118,662 A | 9/2000 | Hutchison et al. |
| 6,151,213 A | 11/2000 | Ater et al. |
| 6,209,631 B1 | 4/2001 | Garcia-Ortiz |
| 6,289,678 B1 | 9/2001 | Pandolfi |
| 6,292,361 B1 | 9/2001 | Johnson et al. |
| 6,292,556 B1 | 9/2001 | Laetsch |
| 6,295,208 B1 | 9/2001 | Murchison et al. |
| 6,310,772 B1 | 10/2001 | Hutchison et al. |
| 6,381,146 B1 | 4/2002 | Sevier |
| 6,396,691 B1 | 5/2002 | Pagnozzi |
| 6,404,637 B2 * | 6/2002 | Hutchison et al. .......... 361/704 |
| 6,406,312 B1 | 6/2002 | Heitkamp |
| 6,421,252 B1 | 7/2002 | White et al. |
| 6,430,044 B2 * | 8/2002 | Hutchinson et al. ........ 361/690 |
| 6,493,236 B1 | 12/2002 | Momiyama et al. |
| 6,496,385 B1 | 12/2002 | Smithson et al. |
| 6,510,223 B2 | 1/2003 | Laetsch |
| 6,535,603 B2 | 3/2003 | Laetsch |
| 6,587,339 B1 | 7/2003 | Daniels et al. |
| 6,611,426 B2 | 8/2003 | Hutchison et al. |
| 2002/0141153 A1 * | 10/2002 | Su .................. 361/687 |
| 2003/0074946 A1 * | 4/2003 | Campo et al. .......... 72/316 |

* cited by examiner

CLAMPING CASE

CROSS RELATED APPLICATION

This application is related to co-pending application Ser. No. 09/919,006 entitled CLAMPING RECEPTACLE and filed on even date herewith.

TECHNICAL FIELD

The present invention relates generally to the field of cases that contain circuit cards and, in particular, to cases that clamp circuit cards within them.

BACKGROUND

Environmentally protected housings are used in a wide variety of applications, including containing and protecting electronic components of the type used for transferring signals over long distances. For example, the telecommunications industry transfers signals over transmission lines. If the signal is transferred over a long distance, the signal may be too weak by the time it reaches its destination to be useful. Consequently, electronic circuits are used to detect, clean up, and amplify a weak signal for retransmission through another length of transmission line. These electronic circuits are often deployed in environmentally protected housings located above and below ground.

Increased demands on the telecommunications industry, such as the advent of HDSL, HDSL2, SHDSL, etc., to meet the increasing needs of internet subscribers has resulted in the need to transfer more and stronger electrical signals over greater distances. One way of accomplishing this is to amplify the signals using electronic circuit cards deployed in environmentally protected housings. To meet the need for transferring stronger electrical signals over greater distances, electronic circuit cards having higher amplification capabilities, and thus greater heat dissipation rates, than the past generations of circuit cards are frequently used.

Many of the environmentally protected housings use cases, or receptacles, to confine circuit cards to different locations within the housings. Typically, these cases are thermally conducting and are thermally coupled to the housing to increase the heat transfer from the circuit cards. However, in many instances, gaps exist between the cases and the circuit cards. These gaps produce relatively large thermal resistances and severely limit heat transfer from the circuit cards. In many instances, this results in thermal failure of the circuit cards.

For the reasons stated above, and for other reasons stated below which will become apparent to those skilled in the art upon reading and understanding the present specification, there is a need in the art for eliminating gaps that exist between circuit cards and the cases that confine these circuit cards to different locations within a housing.

SUMMARY

The above-mentioned problems with gaps that exist between circuit cards and the cases that confine these circuit cards to different locations within a housing and other problems are addressed by embodiments of the present invention and will be understood by reading and studying the following specification. Embodiments of the present invention provide cases that clamp circuit cards within them to improve the thermal contact between the circuit cards and the cases.

More particularly, in one embodiment, a case for confining at least one circuit card to a location within a housing is provided. The case has at least one slot that contains the circuit card. The case also has at least one actuator adapted to clamp the circuit card within the slot.

In another embodiment, a case for confining a pair of circuit cards to different locations within a housing is provided. The case has a pair of opposing sidewalls and first and second end walls. A partition is disposed between the first and second end walls. The partition divides the case into a first slot bounded by a portion of each of the sidewalls, the partition, and the first end wall and a second slot bounded by another portion of each of the sidewalls, the partition, and the second end wall. The first and second slots each contain one of the circuit cards. An actuator is disposed in the first slot between the circuit card in the first slot and the first end wall. The actuator is adapted to bear against the circuit card in the first slot to clamp the circuit card in the first slot, the partition, and the circuit card in the second slot between the actuator and the second end wall.

Other embodiments are described and claimed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figures 1, 2:
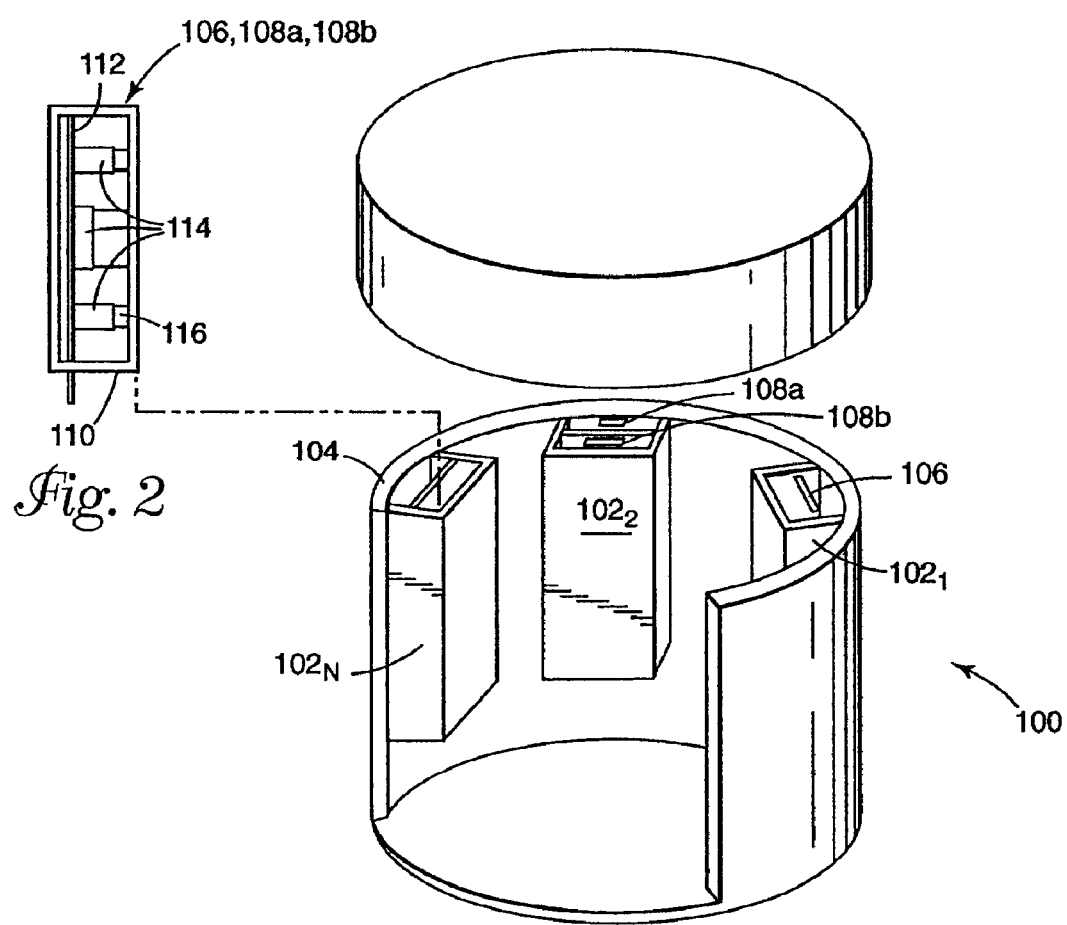
FIG. 1 illustrates an environmentally protected housing according to the teachings of the present invention.
FIG. 2 is an enlarged illustration of a circuit card of the type typically housed in environmentally protected housings.

FIG. 1 shows an environmentally protected housing 100 according to the teachings of the present invention. Housing 100 has several cases $102_1$ to $102_N$ that are thermally coupled to the interior surface of wall 104 of housing 100. Each case $102_1$ to $102_N$ is adapted to receive either a single circuit card, such as circuit card 106, or a pair of circuit cards, such as circuit cards 108a and 108b.

FIG. 2 is an enlarged view of a circuit card, such as circuit card 106, 108a, or 108b. In some instances, circuit card 106, 108a, or 108b includes a thermally conducting case 110 that encloses circuit board 112. Circuit board 112 includes components 114 that are frequently thermally coupled to thermally conducting case 110 by a thermal interface material 116.

Figure 3:
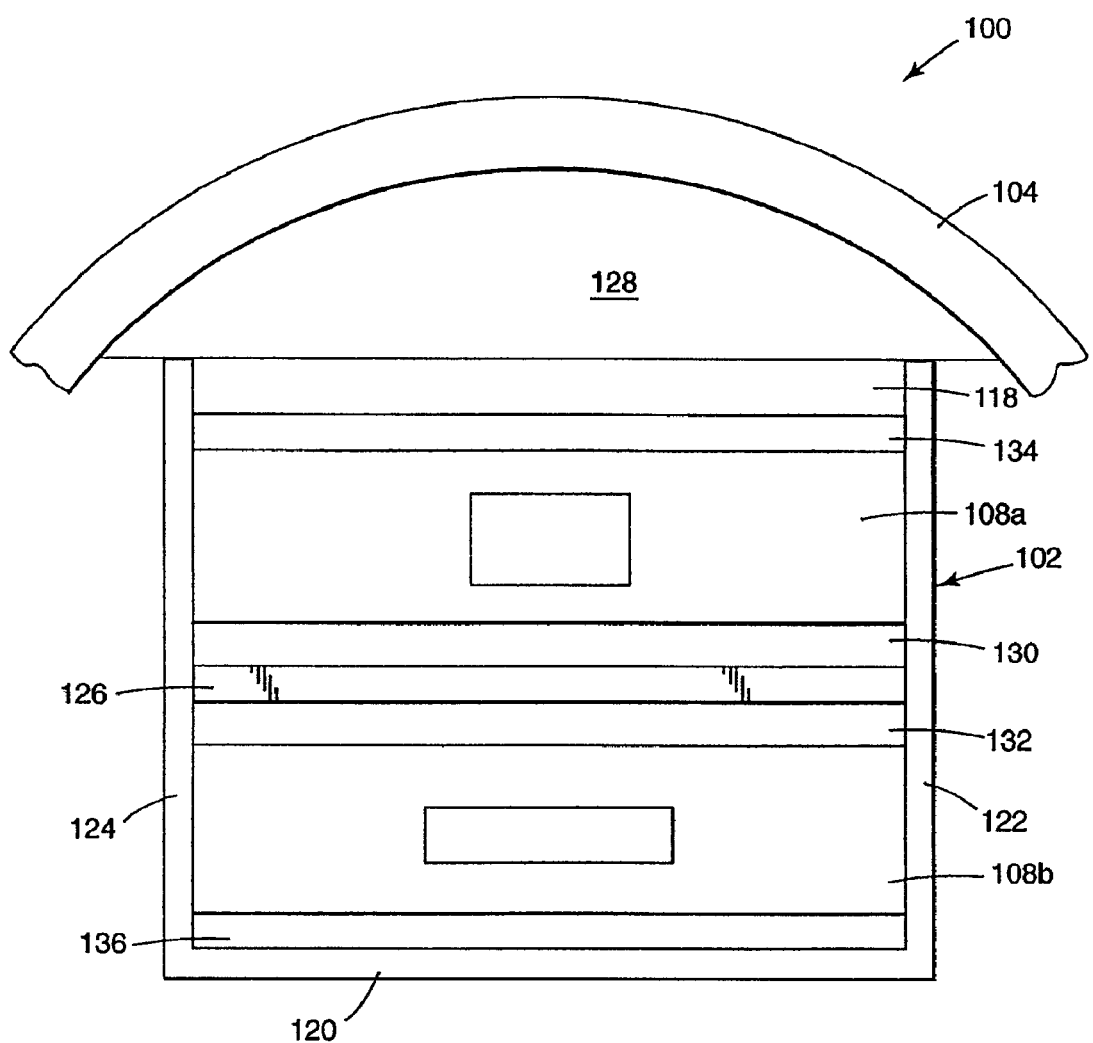
FIG. 3 is a top view of an embodiment of a case of the present invention for confining circuit cards to different locations within an environmentally protected housing.

FIG. 3 is an enlarged top view of a case 102 containing a pair of circuit cards 108a and 108b. Case 102 has end walls 118 and 120, sidewalls 122 and 124, and partition 126 that are typically fabricated from a thermally conducting material such as aluminum, copper, brass, bronze, or the like. Case 102 is thermally coupled at end wall 118 to the interior surface of wall 104 of housing 100 by a heat-sink device 128 that conforms to the contour of the interior surface of wall 104. In one embodiment heat-sink device 128 is a solid block of material having thermal properties suitable for heat sinks, e.g., copper, aluminum, brass, bronze, or the like.

Normally, relatively intimate thermal contact exists between circuit cards 108a and 108b and sidewalls 122 and 124, enabling a portion of the heat dissipated by circuit cards 108a and 108b to be transferred to sidewalls 122 and 124. This portion of the heat is then conducted through sidewalls 122 and 124 into heat-sink device 128.

On the other hand, gaps 130 and 132 respectively exist between circuit cards 108a and 108b and partition 126, and gaps 134 and 136 respectively exist between circuit cards 108a and 108b and end walls 118 and 120, as shown in FIG. 3. Another portion of the heat dissipated by circuit card 108a is conducted and radiated to partition 126 and end wall 118 across the gaps 130 and 134, respectively. Another portion of the heat dissipated by circuit card 108b is conducted and radiated to partition 126 and end wall 120 across the gaps 132 and 136, respectively. Heat conducted and radiated to end wall 118 is conducted through end wall 118 into heat-sink device 128. Heat conducted and radiated to partition 126 and end wall 120 is respectively conducted through partition 126 and end wall 120 into sidewalls 122 and 124, which conduct the heat to heat-sink device 128.

Unfortunately, the respective gaps produce relatively large thermal resistances and severely limit the total heat transfer from circuit cards 108a and 108b to case 102. In many instances, this results in thermal failure of circuit cards 108a and 108b.

Embodiments of the present invention provide cases that clamp circuit cards within them to improve the thermal contact between the circuit cards and the cases. This substantially increases the heat transfer from circuit cards relative to the heat transfer from circuit cards that occurs when the circuit cards are not clamped within the cases, thus reducing the risk of thermal failure. In various embodiments, an actuator, such as a wedge, cam, resilient elements, or the like clamps the circuit cards within the cases.

Figure 4:
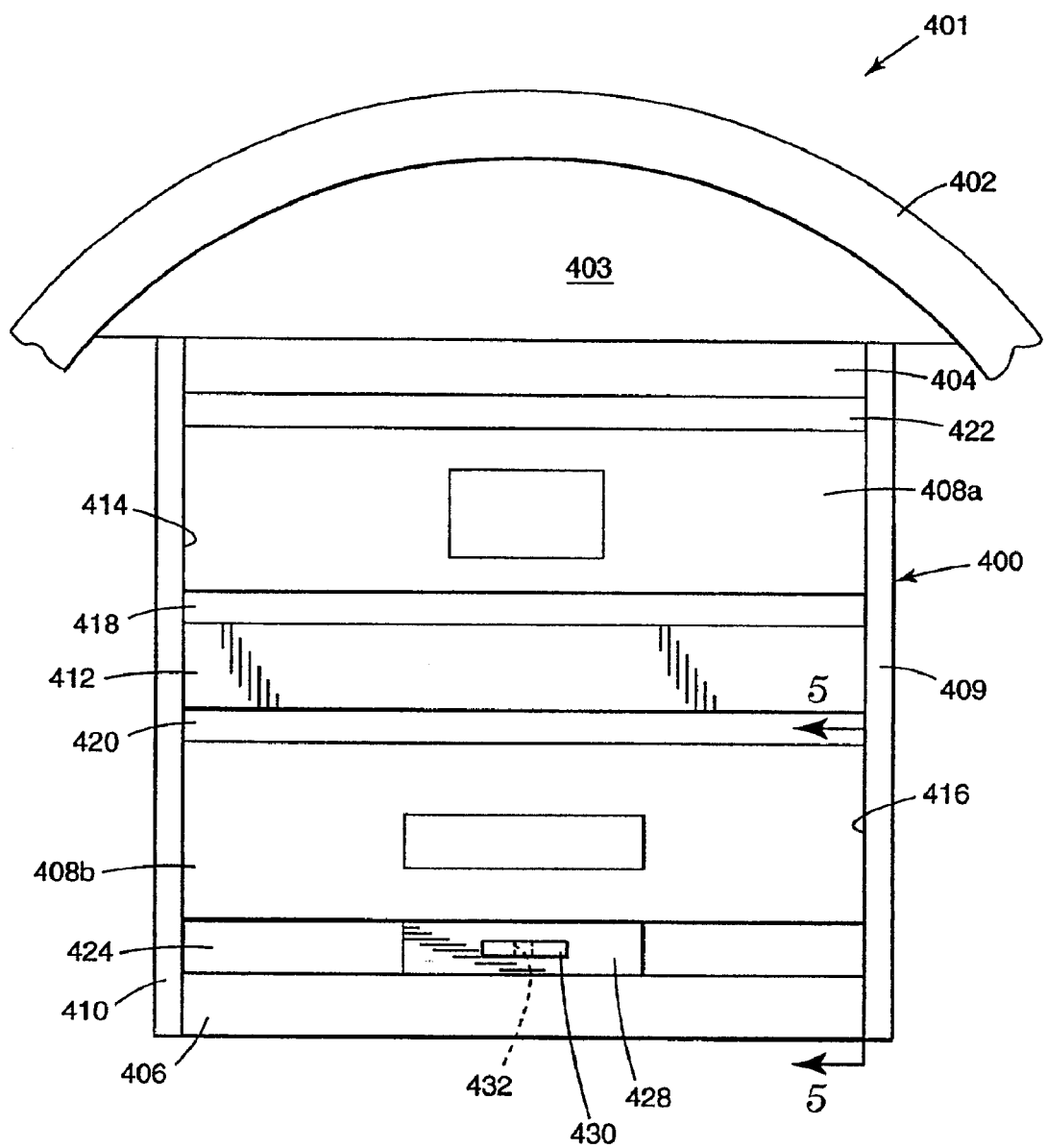
FIG. 4 is a top view of an embodiment of a case of the present invention that uses a wedge to clamp circuit cards within the case.
Figure 5:
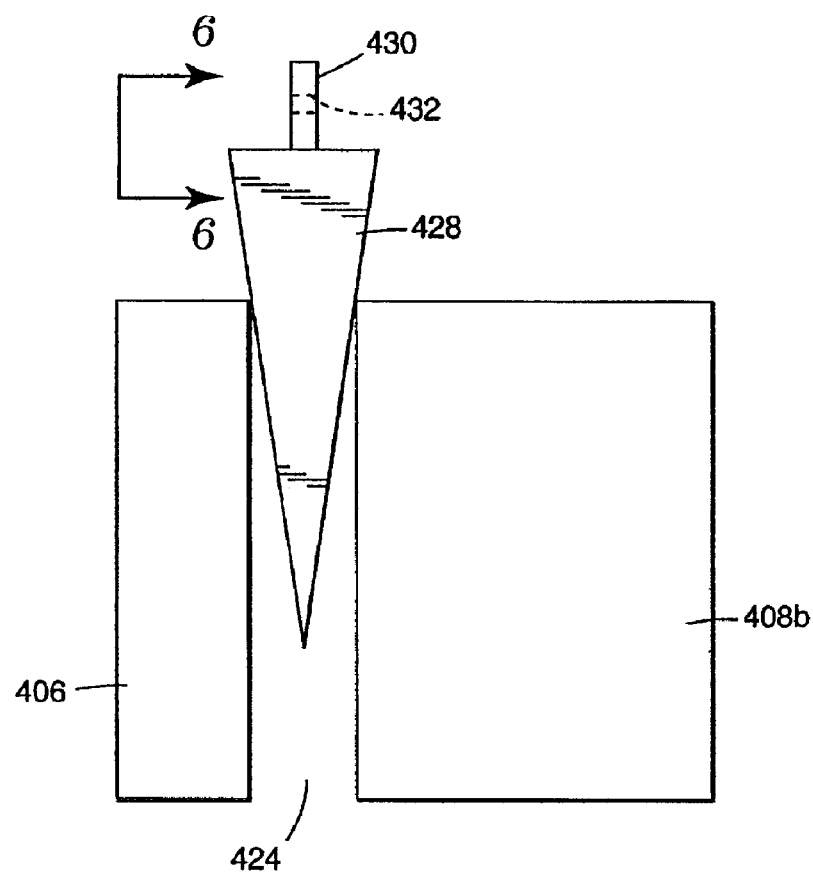
FIG. 5 is a side view of an embodiment of the wedge of FIG. 4 taken along the line 5—5 of FIG. 4.
Figure 6:
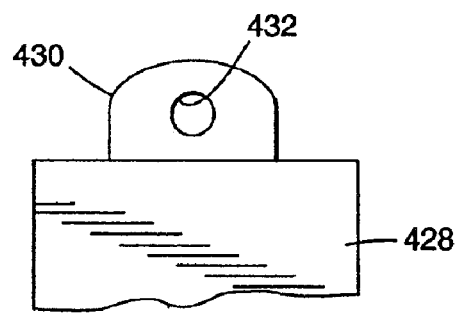
FIG. 6 is a side view of an embodiment of the wedge in FIGS. 4 and 5 taken line 6—6 of FIG. 5.

Case 400, illustrated in FIGS. 4–6, is one embodiment of the present invention. FIG. 4 is a top view of case 400, FIG. 5 a side view taken along the line 5—5 in FIG. 4, and FIG. 6 a view taken along the line 6—6 of FIG. 4. Embodiments of the present invention provide cases that clamp circuit cards within them to improve the thermal contact between the circuit cards and the cases. Case 400 is used to confine circuit cards, e.g., circuit cards 408a and 408b to particular locations within an environmentally protected housing, e.g., environmentally protected housing 401. In one embodiment, circuit cards 408a and 408b are similar to circuit cards 108a and 108b and environmentally protected housing 401 is similar to housing 100. In one embodiment, case 400 confines circuit cards 408a and 408b to a location adjacent a wall 402 of environmentally protected housing 401. In another embodiment, a heat-sink device, such as heat-sink device 403, thermally couples case 400 to an interior surface of wall 402. In one embodiment, heat-sink device 403 is a solid block of material having thermal properties suitable for heat sinks, e.g., copper, aluminum, brass, bronze, or the like.

Case 400 has end walls 404 and 406, sidewalls 409 and 410, and partition 412. End walls 404 and 406, sidewalls 409 and 410, and partition 412, in one embodiment, are fabricated from any thermally conducting material, such as aluminum, copper, brass, bronze, or the like. Partition 412 divides case 400 into slots 414 and 416 that respectively contain circuit cards 408a and 408b.

Partition 412, in one embodiment, is in slidable contact with sidewalls 409 and 410 and can slide toward end walls 404 and 406, respectively. Circuit cards 408a and 408b, in another embodiment, are in slidable contact with sidewalls 409 and 410 and can slide toward end walls 404 and 406, respectively. In other embodiments, thermally conducting grease is disposed between partition 412 and sidewalls 409 and 410 and/or between circuit cards 408a and 408b and sidewalls 409 and 410. The thermally conducting grease increases the thermal contact, and thus the heat transfer, between the partition 412 and sidewalls 409 and 410 and/or between circuit cards 408a and 408b and sidewalls 409 and 410. When circuit cards 408a and 408b are respectively inserted into slots 414 and 416, gaps 418 and 420 respectively exist between circuit cards 408a and 408b and partition 412 and gaps 422 and 424 respectively exist between circuit cards 408a and 408b and end walls 404 and 406, as shown in FIG. 4.

Case 400 includes wedge 428 insertable into gap 424. Wedge 428, in one embodiment, is fabricated from nylon, plastic, metal, or the like. In another embodiment, wedge 428 has a tab 430, and in other embodiments, an aperture 432 passes through tab 430, as shown in FIGS. 4–6. Tab 430 and aperture 432 facilitate insertion and removal of wedge 428 respectively into and from gap 424.

Wedge 428 is pressed into gap 424, causing wedge 428 to engage and to exert a force on circuit card 408b. The force slides circuit card 408b into contact with partition 412. Circuit card 408b exerts a force on partition 412 that slides partition 412 into contact with circuit card 408a. Partition 412 exerts a force on circuit card 408a that slides circuit card 408a, in one embodiment, into contact with end wall 404. This respectively closes gaps 420, 418, and 422 and clamps circuit card 408a, partition 412, circuit card 408b, and end wall 404 in direct thermal contact.

Direct thermal contact between partition 412 and circuit cards 408a and 408b substantially increases the heat transfer from circuit cards 408a and 408b to partition 412 relative to the heat transfer that occurs if gaps 418 and 420 are present. Similarly, direct thermal contact between end wall 404 and circuit card 408a substantially increases the heat transfer from circuit card 408a to end wall 404 relative to the heat transfer that occurs if gap 422 is present. Consequently, this increases the total heat transfer from circuit cards 408a and 408b to case 400, reducing the risk of thermal failure.

Figure 7:
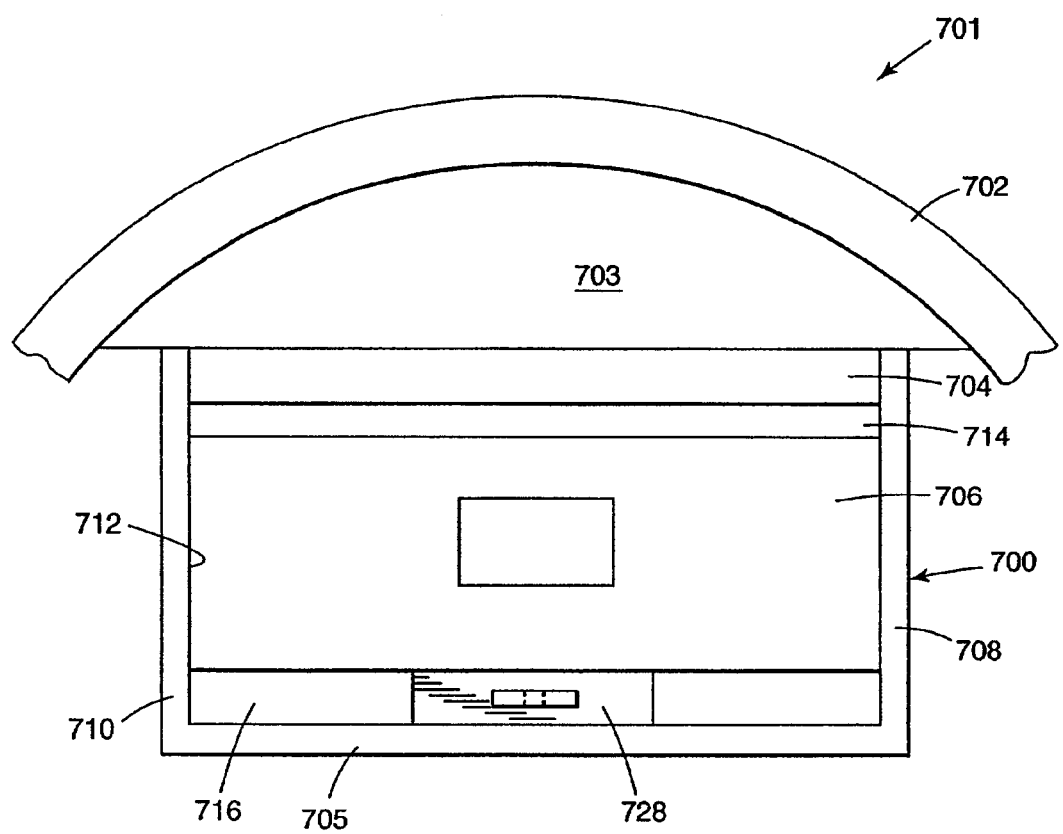
FIG. 7 is a top view of another embodiment of a case of the present invention that uses a wedge for clamping a circuit card within the case.

FIG. 7 shows case 700, another embodiment of the present invention. Case 700 is used to a confine circuit card, e.g., circuit card 706, to a particular location with in an environmentally protected housing, e.g., environmentally protected housing 701. In one embodiment, circuit card 706 is similar to circuit card 106 and environmentally protected housing 701 is similar to housing 100. In another embodiment, case 700 confines circuit card 706 to a location adjacent a wall 702 of environmentally protected housing 701. In other embodiments, a heat-sink device, such as heat-sink device 703, thermally couples case 700 to an interior surface of wall 702. Heat-sink device 703, in one embodiment, is a solid block of material having thermal properties suitable for heat sinks, e.g., copper, aluminum, brass, bronze, or the like.

Case 700 has end walls 704 and 705 and sidewalls 708 and 710. In one embodiment, end walls 704 and 705 and sidewalls 708 and 710 are fabricated from any thermally conducting material, such as aluminum, copper, brass, bronze, or the like. Case 700 defines a slot 712 that receives a circuit card 706. Circuit card 706, in one embodiment, is in slidable contact with sidewalls 708 and 710 and can slide toward end walls 704 and 705, respectively. In one embodiment, thermally conducting grease is disposed between circuit card 706 and sidewalls 708 and 710. When circuit card 706 is inserted into slot 712, gaps 714 and 716 respectively exist between circuit card 706 and end walls 704 and 705.

Case 700 includes wedge 728. Wedge 728 is pressed into gap 716, causing wedge 728 to engage and to exert a force on circuit card 706. The force, in one embodiment, slides circuit card 706 into direct contact with end wall 704, thereby closing gap 714 to clamp circuit card 706 and end wall 704 in direct thermal contact. In one embodiment, wedge 728 is as described for wedge 428 above.

Figure 8:
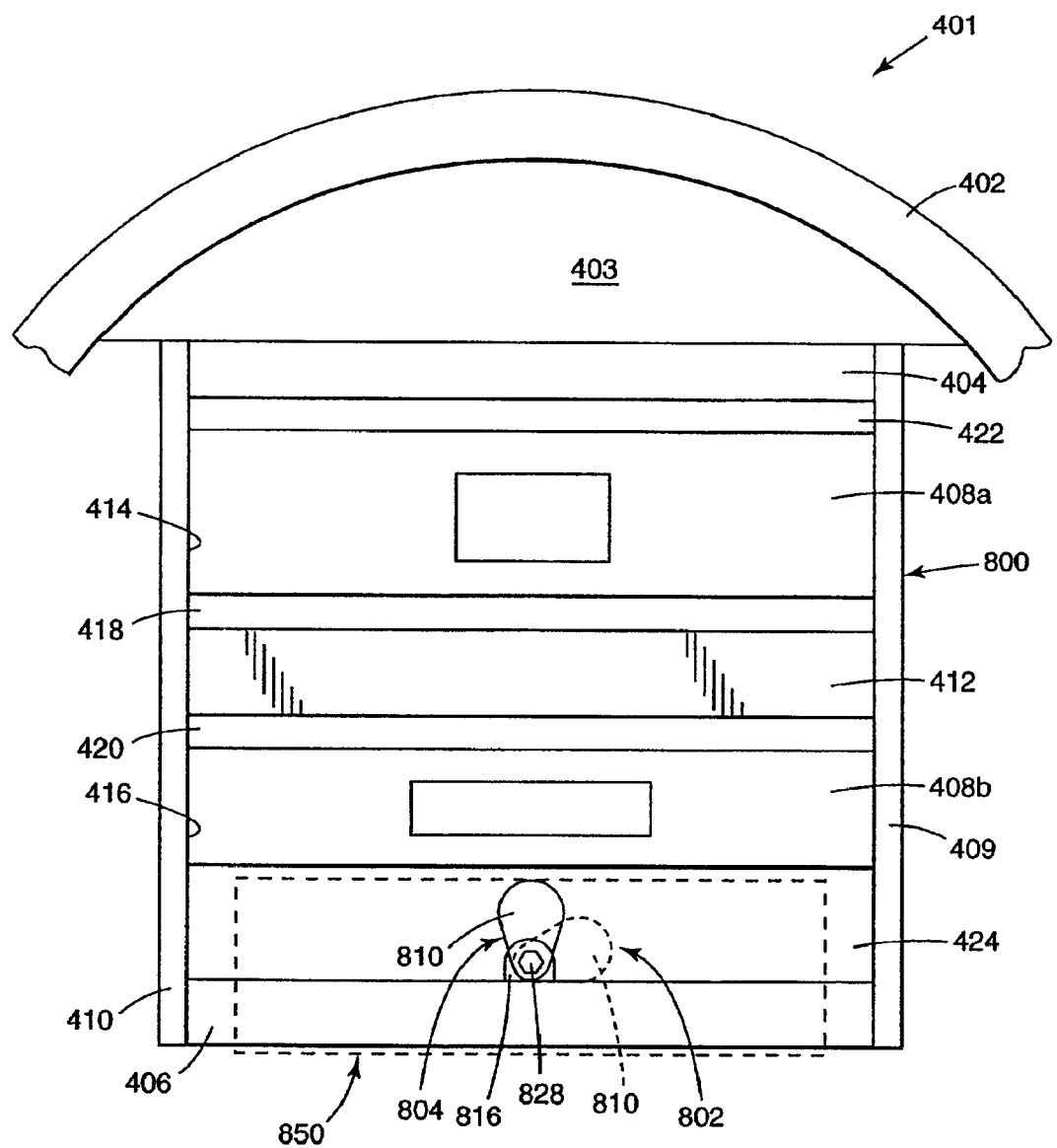
FIG. 8 is a top view of an embodiment of a case of the present invention that uses a cam to clamp circuit cards within the case.

FIG. 8 illustrates case 800, another embodiment of the present invention. Elements that are common to FIGS. 4 and 8 are numbered as in FIG. 4 and are as described above. Case 800 includes a cam 810 that is disposed within gap 424 between end wall 406 and circuit card 408b.

Cam 810, in one embodiment, is rotated from position 802 to position 804 so that a portion of cam 810 engages and exerts a force on circuit card 408b. The force slides circuit card 408b into contact with partition 412. Circuit card 408b exerts a force on partition 412 that slides partition 412 into contact with circuit card 408a. In one embodiment, partition 412 exerts a force on circuit card 408a that slides circuit card 408a into contact with end wall 404. This respectively closes gaps 420, 418, and 422 and clamps circuit card 408a, partition 412, circuit card 408b, and end wall 404 in direct thermal contact.

Cam 810, in one embodiment, is fabricated from metal, e.g., steel or aluminum, plastic, or the like. In another embodiment, serrations 812 are distributed over the curved surface of cam 810, as shown in FIG. 10, which is the surface that bears against circuit card 108b. In another embodiment, serrations 812 are rubber and are molded onto cam 410. Serrations 812 improve the contact resistance between cam 810 and circuit card 408b and facilitate the clamping of circuit card 408a, partition 412, circuit card 408b between cam 810 and end wall 404. In one embodiment, cam 810 has aperture 814 passing through it for receiving a shaft, such as shaft 817 shown in FIG. 9.

Figure 9:
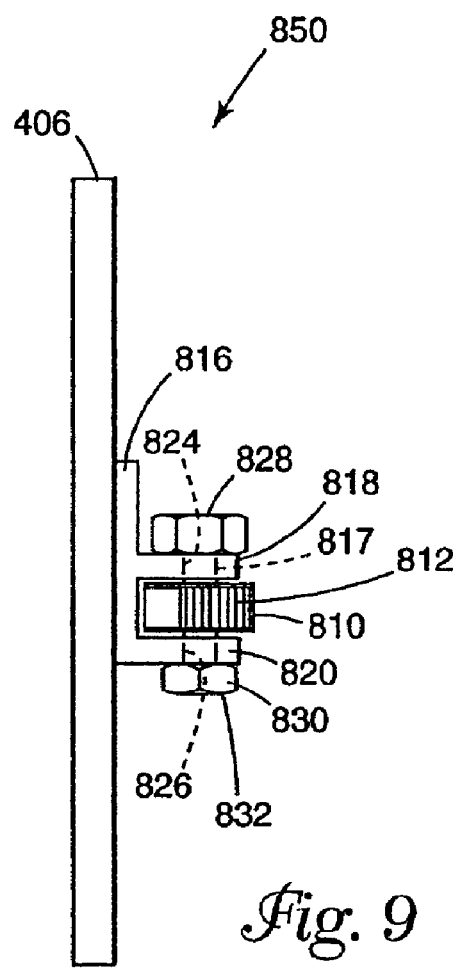
FIG. 9 is a side view illustrating an embodiment of a cam used for clamping circuit cards within a case.
Figure 10:
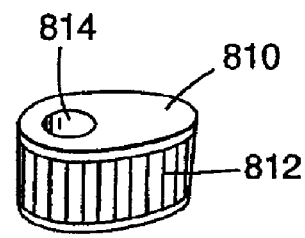
FIG. 10 is an enlarged view of a cam.

FIG. 9 is a side view of region 850 in FIG. 8 corresponding to one embodiment of case 800. As seen in FIG. 9, cam 810 is rotatably attached to end wall 406 using a bracket 816 and a shaft 817. Bracket 816 includes protrusions 818 and 820, respectively having apertures 824 and 826 passing therethrough. Cam 810 is rotatably attached to end wall 406 by positioning cam 810 between protrusions 818 and 820 to align aperture 814 of cam 810 with apertures 824 and 826 and passing shaft 817 through apertures 824, 814, and 826. Cam 810 rotates about the longitudinal axis of shaft 817 and moves relative to protrusions 818 and 820 of bracket 816.

Bracket 816, in one embodiment, is fabricated from metal, e.g., steel or aluminum, plastic, or the like and is fixed to end wall 406 by welding, gluing, bolting, or the like. In one embodiment, cam 810 is secured to shaft 817 using cap screws, set screws, an interference fit, or the like. Shaft 817, in one embodiment, is fabricated from metal, e.g., steel, aluminum, or the like, plastic, or the like. Shaft 817, in one embodiment, has a head 828 at one of its ends that is hexagonal, as shown in FIG. 8, square, slotted, Phillips, Allen, or the like. In one embodiment, a nut 830 that is hexagonal or square is threaded onto shaft 817 at end 832 of shaft 817. To rotate cam 810, a torque is applied to head 828 using an appropriate wrench, screwdriver, or the like.

Figure 11:
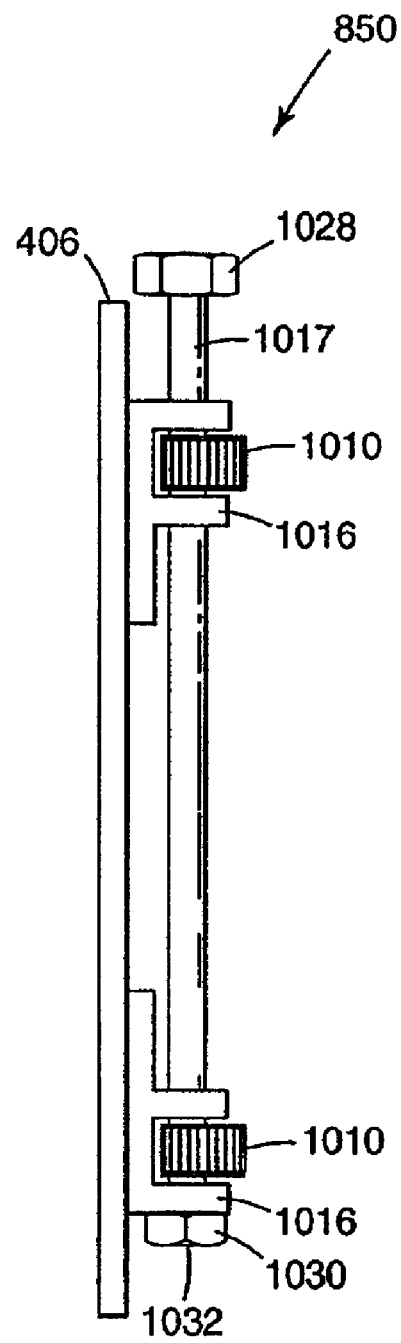
FIG. 11 is a side view illustrating another embodiment of a cam used for clamping circuit cards within a case.

FIG. 11 is a side view of region 850 in FIG. 8 corresponding to another embodiment of case 800. The embodiment of FIG. 11 includes two cams 1010 that are rotatably attached to end wall 406 in tandem using a bracket 1016 for each cam 1010 and shaft 1017 that passes through the respective brackets 1016 and cams 1010. In other embodiments, bracket 1016 and cams 1010 are as described above for bracket 816 and cam 810. Shaft 1017, in one embodiment, has a head 1028 at one of its ends that is hexagonal, as shown in FIG. 11, square, slotted, Phillips, Allen, or the like. In one embodiment, a nut 1030 that is hexagonal or square is threaded onto shaft 1017 at end 1032. Cams 1010 are rotated into engagement with circuit card 408b by applying a torque to head 1028 using an appropriate wrench, screwdriver, or the like.

Figure 12:
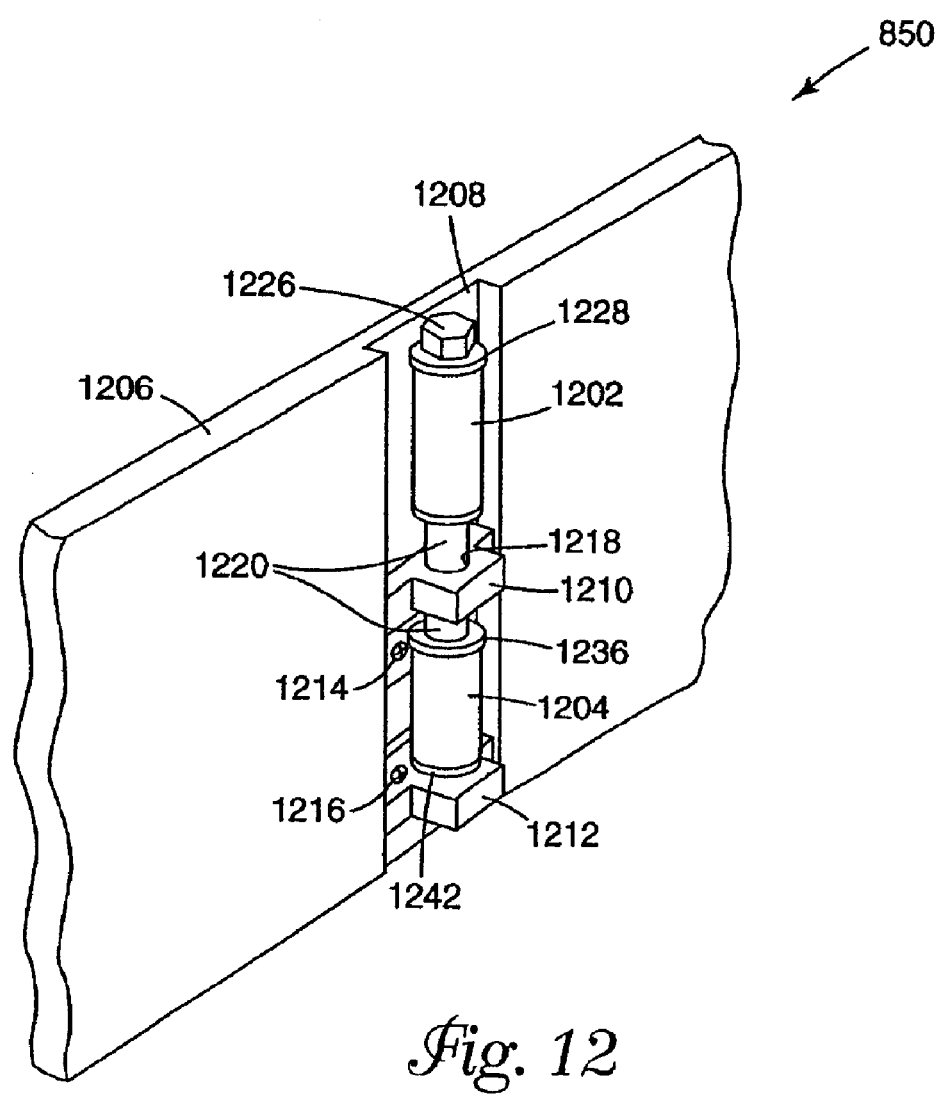
FIG. 12 is an isometric view of an embodiment of a device that uses resilient elements for clamping circuit cards within a case.
Figure 13:
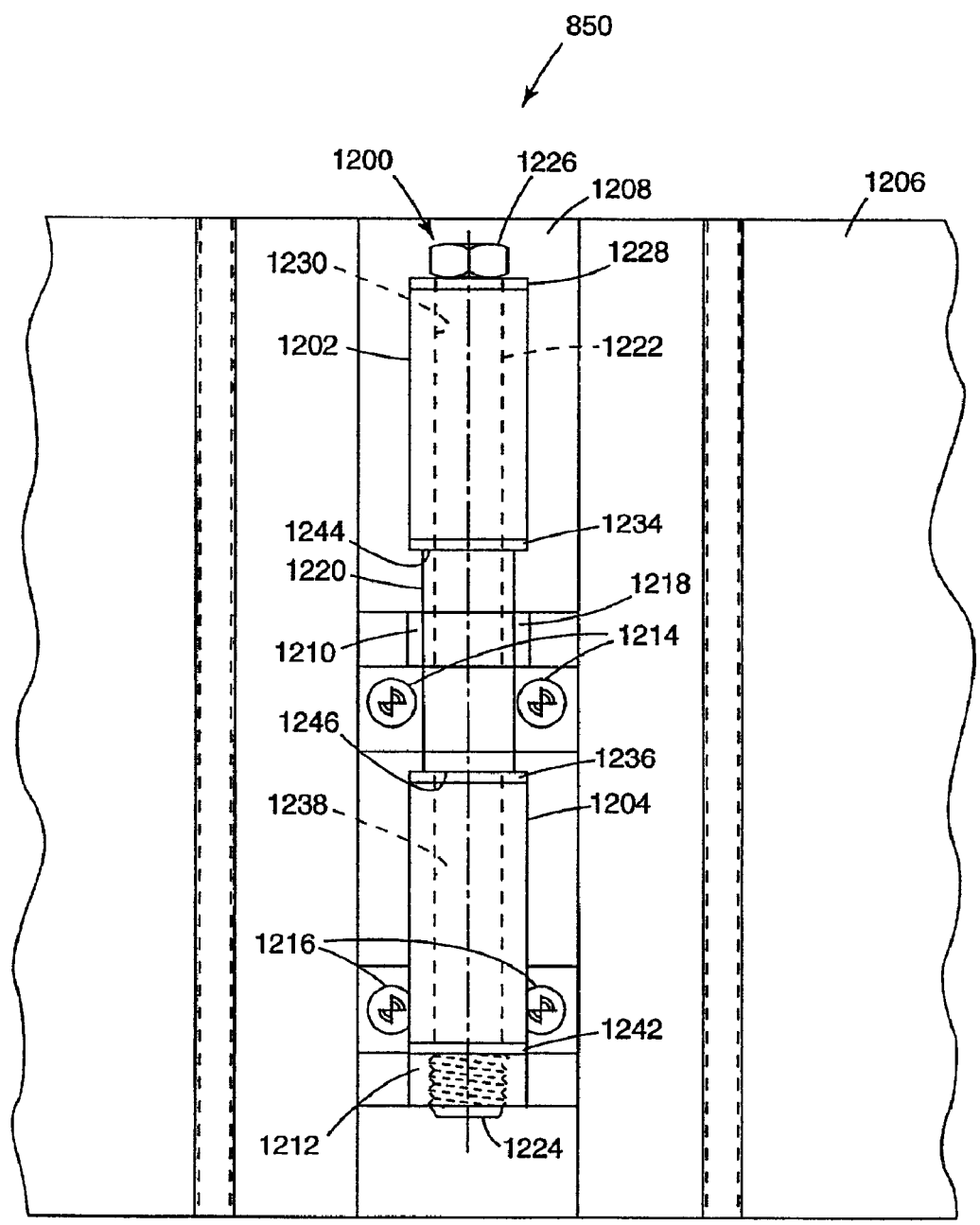
FIG. 13 is a front view of FIG. 12.
Figure 14:
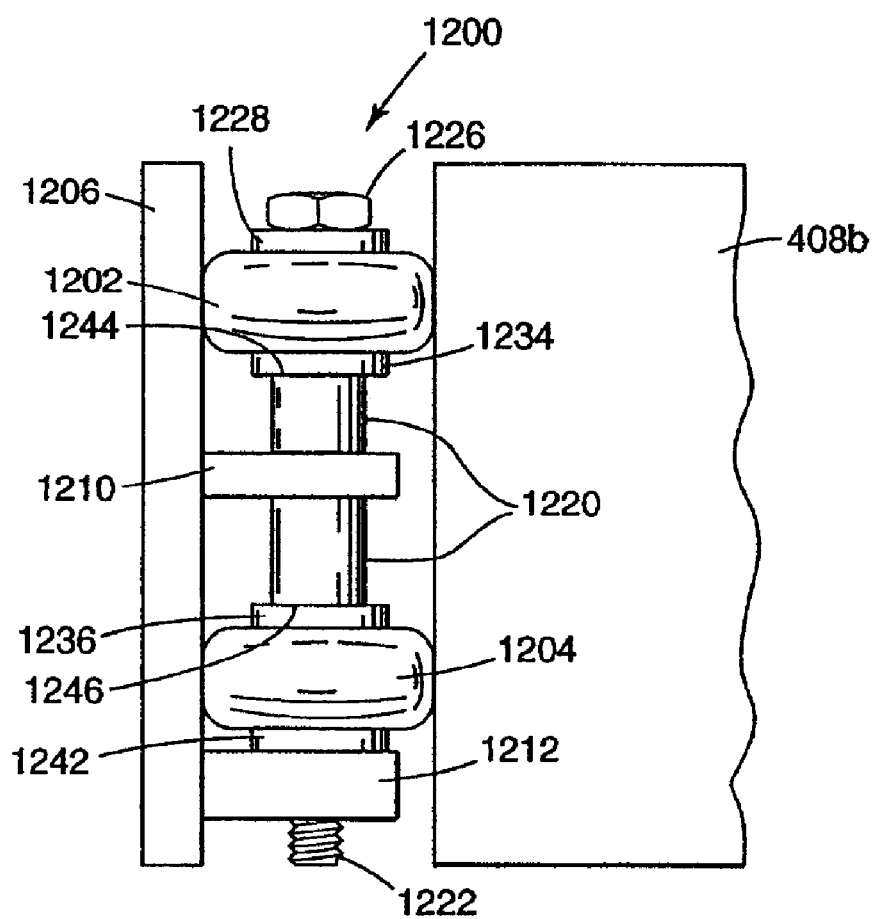
FIG. 14 is a side view of resilient elements engaging a circuit card.

FIG. 12 is an isometric view of region 850 in FIG. 8 corresponding to yet another embodiment of case 800. FIG. 13 is a side view of FIG. 12, and FIG. 14 illustrates the embodiment of FIG. 12 in operation. In the embodiment of FIG. 12, end wall 1206 replaces end wall 406 and resilient elements 1202 and 1204 replace cam 810.

End wall 1206 includes recess 1208. In one embodiment, a bracket 1210 and a nut 1212 are disposed within recess 1208 and are respectively fastened to wall 1206 using fasteners 1214 and 1216, as shown in FIGS. 12 and 13. Bracket 1210 and nut 1212, in one embodiment, are fabricated from metal, such as steel or aluminum, plastic, or the like. Fasteners 1214 and 1216, in one embodiment, are screws or bolts. Alternatively, bracket 1210 and nut 1212, in other embodiments, are fastened to end wall 1206 by welding, gluing, or the like. In another embodiment, bracket 1210 and nut 1212 are fastened to a wall with no recess, such as end wall 406.

Bracket 1210 has an aperture 1218 passing through it, as shown in FIGS. 12 and 13. A sleeve 1220 passes through aperture 1218 and is slidable within aperture 1218. A shaft 1222 passes through sleeve 1220 and is movable therein. An end 1224 of shaft 1222 is threaded into nut 1212. Shaft 1222, in one embodiment, is fabricated from metal, e.g., steel, aluminum, or the like, plastic, or the like. Shaft 1222, in one embodiment, has a head 1226 at an end opposite end 1224 that is hexagonal, as shown in FIGS. 12 and 13, square, slotted, Phillips, Allen, or the like.

In one embodiment, shaft 1222 sequentially passes through a washer 1228, an aperture 1230 in resilient element 1202, a washer 1234, sleeve 1220, a washer 1236, an aperture 1238 in resilient element 1204, and a washer 1242 and threads into nut 1212, as shown in FIG. 13. Resilient element 1202 is sandwiched between washers 1228 and 1234, and resilient element 1204 is sandwiched between washers 1236 and 1242. Washers 1234 and 1236 respectively abut sleeve 1220 at ends 1244 and 1246 of sleeve 1220, while washers 1228 and 1242 respectively abut head 1226 of shaft 1222 and nut 1212. Shaft 1222 is movable within washer 1228, aperture 1230 of resilient element 1202, washer 1234, washer 1236, aperture 1238 of resilient element 1204, and washer 1242.

Resilient elements 1202 and 1204, in one embodiment, are elastomers, e.g., polyvinyl, rubber, or the like. Washers 1228, 1234, 1236, and 1242, in one embodiment, are metal, e.g., aluminum or steel, plastic, or the like and are circular, as shown in FIG. 12, square, etc.

In operation, a torque is applied to head 1226 of shaft 1222 using an appropriate wrench, screwdriver, or the like to thread shaft 1222 into nut 1212, causing shaft 1222 to move axially into nut 1212. This compresses resilient elements 1202 and 1204 axially between head 1226 and nut 1212, causing resilient elements 1202 and 1204 to bulge in generally the radial direction, as shown in FIG. 14. As resilient elements 1202 and 1204 bulge radially, resilient elements 1202 and 1204 engage circuit card 408b to exert a force on circuit card 408b, as shown in FIG. 14. This force closes gaps 420, 418, and 422 and clamps circuit card 408a, partition 412, circuit card 408b, and end wall 404 in direct thermal contact, as described above.

More specifically, when a torque is applied to head 1226 of shaft 1222, head 1226 exerts an axial force on washer 1228, which in turn exerts an axial force on resilient element 1202. A portion of the axial force exerted on resilient element 1202 compresses resilient element 1202 axially, causing resilient element 1202 to bulge in generally the radial direction, as shown in FIG. 14. Another portion of the axial force exerted on resilient element 1202 is transmitted to washer 1234, which in turn exerts an axial force on end 1244 of sleeve 1220. The axial force exerted on sleeve 1220 slides sleeve 1220 relative to bracket 1210 within aperture 1218 of bracket 1210. This causes end 1246 to exert an axial force on washer 1236, which in turn exerts an axial force on resilient element 1204. The axial force exerted on resilient element 1204 compresses resilient element 1204 axially between washer 1236 and washer 1242, causing resilient element 1204 to bulge in generally the radial direction, as shown in FIG. 14.

Figure 15:
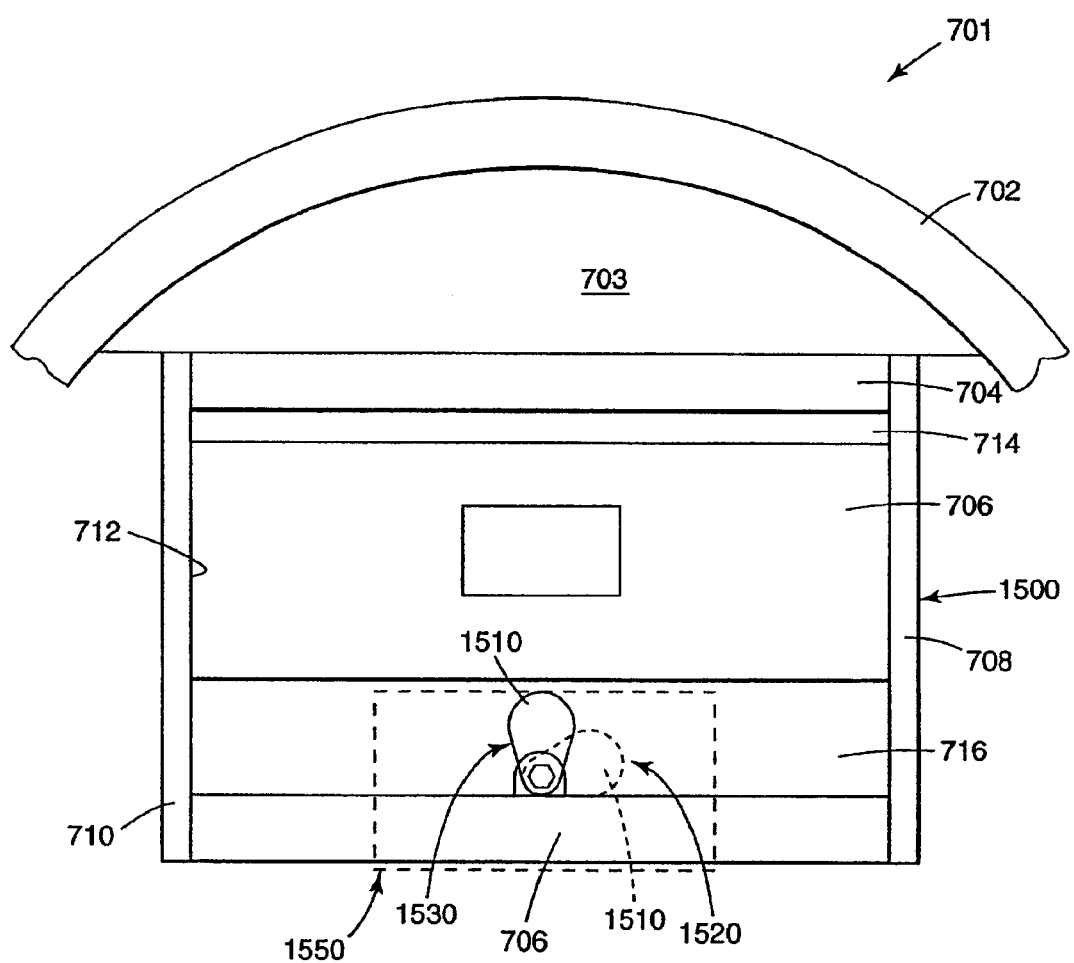
FIG. 15 is a top view of another embodiment of a case of the present invention that uses a cam for clamping a circuit card within the case.

FIG. 15 illustrates case 1500, another embodiment of the present invention. Elements that are common to FIGS. 15 and 7 are numbered as in FIG. 7 and are as described above. Cam 1510 is rotated from a position 1520 to a position 1530, as shown in FIG. 15, so that a portion of cam 1510 engages circuit card 706 to exert a force on circuit card 706. The force, in one embodiment, slides circuit card 706 into direct contact with end wall 704, thereby closing gap 714 to clamp circuit card 706 and end wall 704 in direct thermal contact.

In one embodiment, region 1550 of FIG. 15 is as described for region 850 of FIG. 8 above for the embodiment of case 800 shown in FIGS. 9 and 10, and cam 1510 is as described for cam 810. In another embodiment, region 1550 of FIG. 15 is as described for region 850 of FIG. 8 above for the embodiment of case 800 shown in FIG. 11, and a pair of cams in tandem engages circuit card 706 to exert a force on circuit card 706. In yet another embodiment, region 1550 of FIG. 15 is as described for region 850 of FIG. 8 above for the embodiment of case 800 shown in FIGS. 12–14, and a pair of resilient elements engages circuit card 706 to exert a force on circuit card 706.

Figure 16:
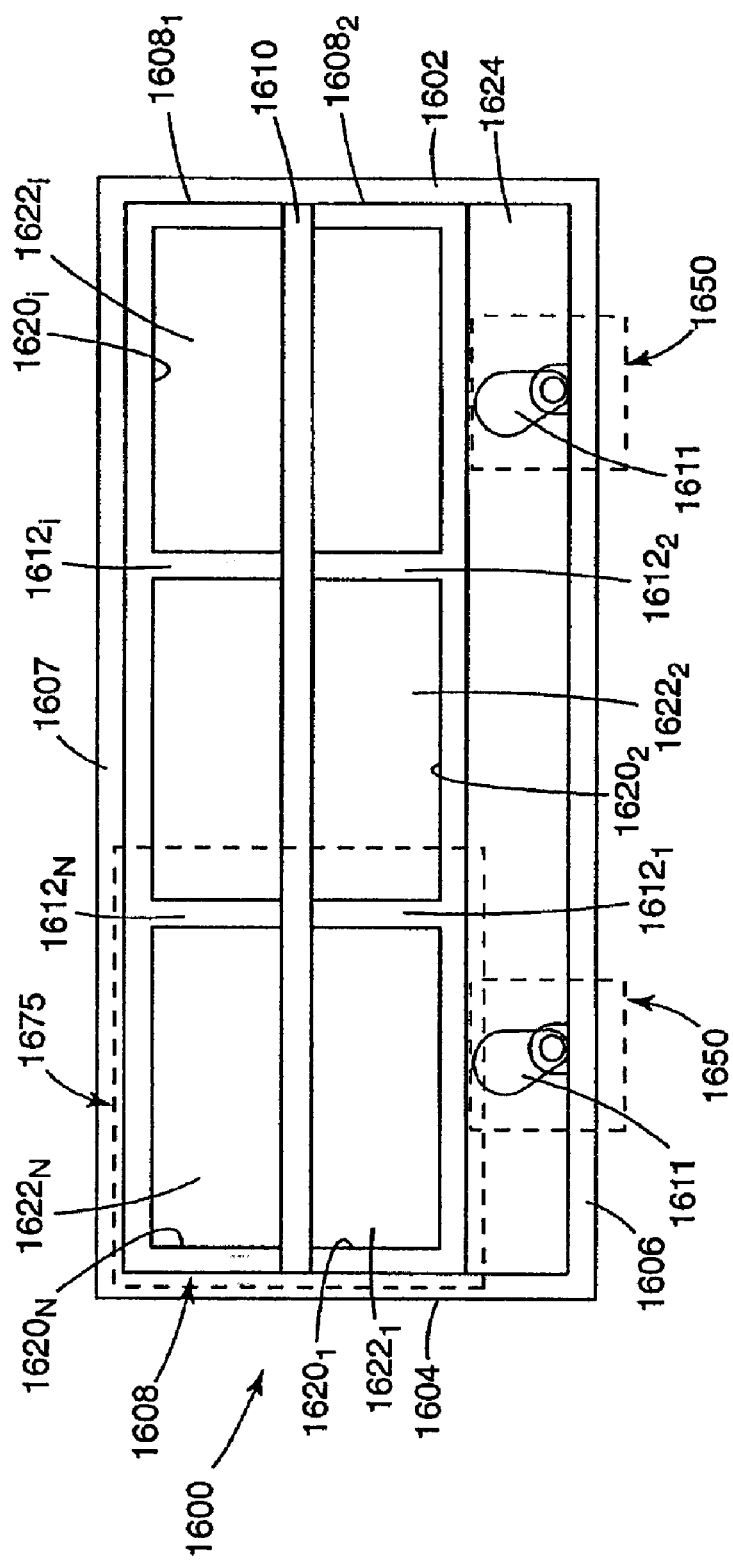
FIG. 16 is a top view of an embodiment of a case of the present invention that has a frame and that uses cams for clamping several circuit cards within the frame.

FIG. 16 illustrates receptacle 1600, another embodiment of the present invention. Receptacle 1600 includes sidewalls 1602 and 1604 and end walls 1606 and 1607 that are fabricated from materials having suitable thermal and structural properties, such as aluminum, copper, brass, bronze, or the like.

Receptacle 1600 includes a frame 1608 divided into sub-frames $1608_1$ and $1608_2$ by partition 1610. Sub-frame $1608_2$ and partition 1610, in one embodiment, are in slidable contact with sidewalls 1602 and 1604. Sub-frames $1608_1$ and $1608_2$ are respectively partitioned into an array of slots having slots $1620_1$ to $1620_N$ by partitions $1612_1$ to $1612_N$ that are perpendicular to partition 1610, as shown in FIG. 16. Each slot of slots $1620_1$ to $1620_N$ respectively confines one of circuit cards $1622_1$ to $1622_N$ to a particular location within case 1600. Frame 1608 is fabricated from materials having suitable thermal and structural properties, such as aluminum, copper, brass, bronze, or the like. Circuit cards $1622_1$ to $1622_N$, in one embodiment, are as described above for circuit card 106 108a, or 108b.

A gap 1624 separates frame 1608 from end wall 1606. Cams 1611 are disposed within gap 1624. Cams 1611 are rotated into and out of engagement with frame 1608. When cams 1611 engage frame 1608, cams 1611 respectively exert a force on frame 1608, and, in particular, sub-frame $1608_2$.

In one embodiment, regions 1650 of FIG. 16 are as described for region 850 of FIG. 8 above for the embodiment of case 800 shown in FIGS. 9 and 10, and cams 1611 are as described for cam 810. In another embodiment, regions 1650 of FIG. 16 are as described for region 850 of FIG. 8 above for the embodiment of case 800 shown in FIG. 11, and two tandem pairs of cams engage frame 1608 to exert a force on frame 1608. In yet another embodiment, regions 1650 of FIG. 16 are as described for region 850 of FIG. 8 above for the embodiment of case 800 shown in FIGS. 12–14, and two pairs of resilient elements engage frame 1608 to exert a force on frame 1608. In other embodiments, a single region 1650 midway between sidewalls 1602 and 1604 replaces regions 1650, and a single cam, a tandem pair of cams, or a pair of resilient elements are located midway between sidewalls 1602 and 1604.

Figure 17:
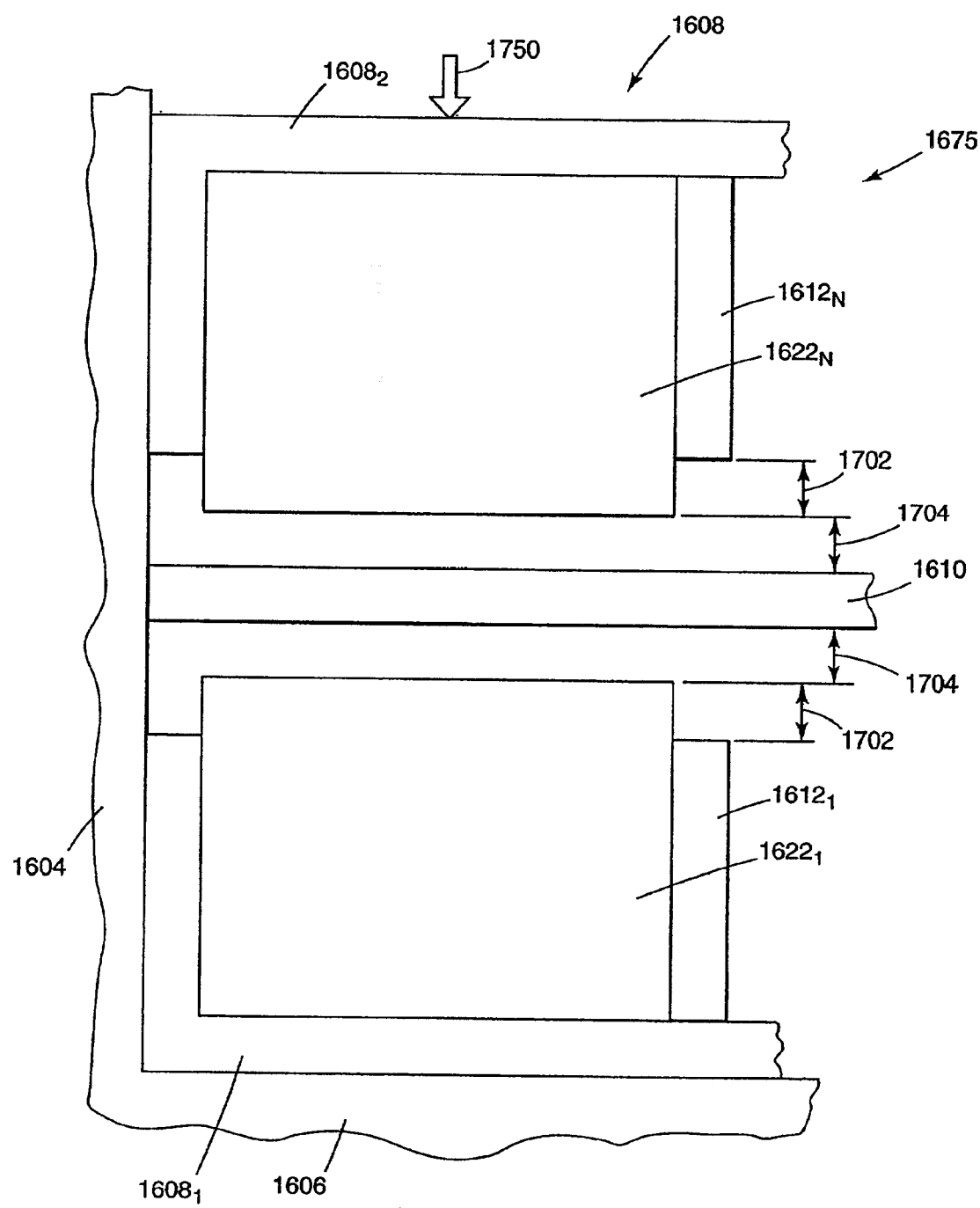
FIG. 17 is an enlarged view of region 1675 of FIG. 16.

FIG. 17 is an enlarged view of region 1675 of FIG. 16 and corresponds to when a force, as represented by arrow 1750, is initially exerted on sub-frame $1608_2$, for example, by cam 1611. FIG. 17 shows, in one embodiment, that the circuit cards $1622_1$ to $1622_N$, e.g., circuit cards $1622_1$ and $1622_N$, extend beyond sub-frames $1608_1$ and $1608_2$ and partitions $1612_1$ to $1612_N$, e.g., $1612_1$ and $1612_N$, by a distance 1702. In other embodiments, the distance 1702 is substantially zero, and circuit cards $1622_1$ to $1622_N$ are substantially flush with sub-frames $1608_1$ and $1608_2$ and partitions $1612_1$ to $1612_N$. Moreover, circuit cards $1622_1$ to $1622_N$, e.g., circuit cards $1622_1$ and $1622_N$, are each separated from partition 1610 by a gap 1704.

When a force, as indicted by arrow 1750, is exerted on frame 1608 at sub-frame $1608_2$, the force slides sub-frame $1608_2$ so that the circuit cards of circuit cards $1622_1$ to $1622_N$ that are in sub-frame $1608_2$ contact partition 1610 and exert a force on partition 1610. The force exerted on partition 1610 slides partition 1610 into contact with the circuit cards of circuit cards $1622_1$ to $1622_N$ that are in sub-frame $1608_1$. In this way, the circuit cards of circuit cards $1622_1$ to $1622_N$ contained in the slots of sub-frame $1608_2$ are clamped between sub-frame $1608_2$ and partition 1610, and the circuit cards of circuit cards $1622_1$ to $1622_N$ contained in the slots of sub-frame $1608_1$ are clamped between and partition 1610 and sub-frame $1608_1$. Therefore, circuit cards $1622_1$ to $1622_N$ are clamped in direct contact with frame 1608, which is in contact with end walls 1606 and 1607 and sidewalls 1602 and 1604 of case 1600. This substantially increases the heat transfer from circuit cards $1622_1$ to $1622_N$ to case 1600 relative to situations where circuit cards $1622_1$ to $1622_N$ are not clamped in direct contact with frame 1608.

Figure 18:
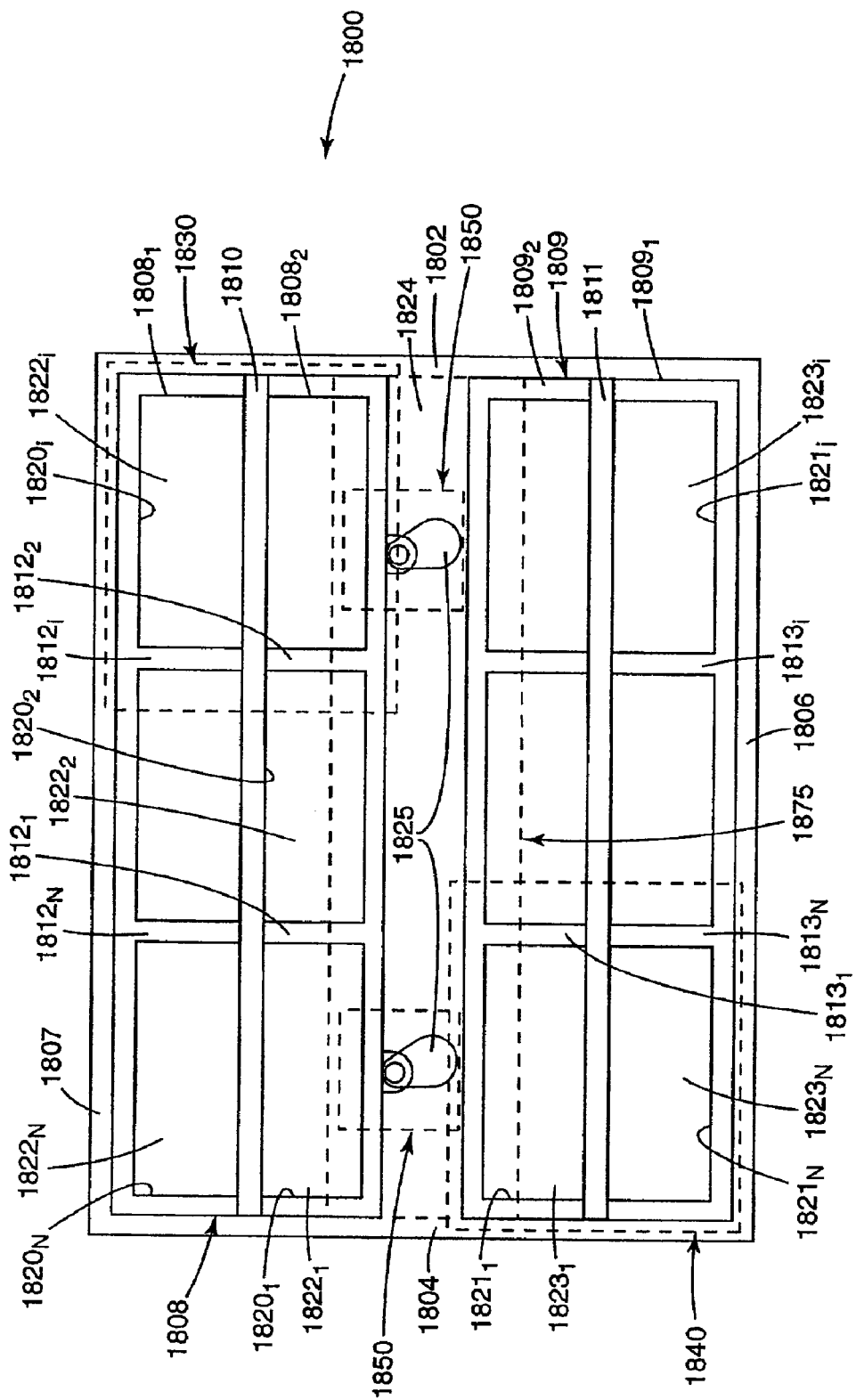
FIG. 18 is a top view of an embodiment of a case of the present invention that has a pair of frames and that uses cams for clamping several circuit cards within the frames.

FIG. 18 illustrates receptacle 1800, another embodiment of the present invention. Receptacle 1800 includes sidewalls 1802 and 1804 and end walls 1806 and 1807 that are fabricated from materials having suitable thermal and structural properties, such as aluminum, copper, brass, bronze, or the like.

Receptacle 1800 includes frames 1808 and 1809, respectively divided into sub-frames $1808_1$ and $1808_2$ by partition 1810 and sub-frames $1809_1$ and $1809_2$ by partition 1811. Sub-frames $1808_2$ and $1809_2$ and partitions 1810 and 1811, in one embodiment, are in slidable contact with sidewalls 1802 and 1804. Sub-frames $1808_1$ and $1808_2$ are partitioned into an array of slots having slots $1820_1$ to $1820_N$ by partitions $1812_1$ to $1812_N$ that are perpendicular to partition 1810, as shown in FIG. 18. Sub-frames $1809_1$ and $1809_2$ are partitioned into an array of slots having slots $1821_1$ to $1821_N$ by partitions $1813_1$ to $1813_N$ that are perpendicular to partition 1811, as shown in FIG. 18. Each slot of slots $1820_1$ to $1820_N$ respectively confines one of circuit cards $1822_1$ to $1822_N$ to a particular location within frame 1808. Each slot of slots $1821_1$ to $1821_N$ respectively confines one of circuit cards $1823_1$ to $1823_N$ to a particular location within frame 1809.

Frames 1808 and 1809 are fabricated from materials having suitable thermal and structural properties, such as aluminum, copper, brass, bronze, or the like. Circuit cards $1822_1$ to $1822_N$ and circuit cards $1823_1$ to $1823_N$, in one embodiment, are as described above for circuit card 106, 108a, or 108b.

Frames 1808 and 1809 are separated by a gap 1824 that contains cams 1825. Each cam 1825 is rotatably attached to frame 1808, and, in particular, to sub-frame $1808_2$ of frame 1808. Cams 1825 are rotated into and out of engagement with frame 1809, and, in particular, into and out of engagement with sub-frame $1809_2$ of frame 1809. When cams 1825 engage sub-frame $1809_2$, cams 1825 respectively exert a force on sub-frame $1809_2$ producing a reaction force that is exerted on sub-frame $1808_2$. In this way, when each cam 1825 is rotated into engagement with frame 1809, a force is exerted on both frames 1809 and 1808, and, in particular, on both sub-frames $1809_2$ and $1808_2$.

In one embodiment, the regions 1830 and 1840 are as described for region 1675 in FIG. 16. When a force is exerted on both sub-frames $1809_2$ and $1808_2$, e.g., by each of cams 1825, the force slides sub-frame $1808_2$ so that the circuit cards of circuit cards $1822_1$ to $1822_N$ that are in sub-frame $1808_2$ contact partition 1810 and exert a force on partition 1810. The force exerted on partition 1810 slides partition 1810 into contact with the circuit cards of circuit cards $1822_1$ to $1822_N$ that are in sub-frame $1808_1$. In this way, the circuit cards of circuit cards $1822_1$ to $1822_N$ contained in the slots of sub-frame $1808_2$ are clamped between sub-frame $1808_2$ and partition 1810, and the circuit cards of circuit cards $1822_1$ to $1822_N$ contained in the slots of sub-frame $1808_1$ are clamped between and partition 1810 and sub-frame $1808_1$.

The force also slides sub-frame $1809_2$ so that the circuit cards of circuit cards $1823_1$ to $1823_N$ that are in sub-frame $1809_2$ contact partition 1811 and exert a force on partition 1811. The force exerted on partition 1811 slides partition 1811 into contact with the circuit cards of circuit cards $1823_1$ to $1823_N$ that are in sub-frame $1809_1$. In this way, the circuit cards of circuit cards $1823_1$ to $1823_N$ contained in the slots of sub-frame $1809_2$ are clamped between sub-frame $1809_2$ and partition 1811, and the circuit cards of circuit cards $1823_1$ to $1823_N$ contained in the slots of sub-frame $1809_1$ are clamped between and partition 1811 and sub-frame $1809_1$.

In one embodiment, regions 1850 of FIG. 18 are as described for region 850 of FIG. 8 above for the embodiment of case 800 shown in FIGS. 9 and 10, and cams 1825 are as described for cam 810. In another embodiment, regions 1850 of FIG. 18 are as described for region 850 of FIG. 8 above for the embodiment of case 800 shown in FIG. 11, and two tandem pairs of cams are attached to frame 1808 and are rotated to engage frame 1809 to exert a force on both frames 1808 and 1809. In yet another embodiment, regions 1850 of FIG. 18 are as described for region 850 of FIG. 8 above for the embodiment of case 800 shown in FIGS. 12–14, and two pairs of resilient elements are attached to frame 1808 and engage frame 1809 to exert a force on both frames 1808 and 1809. In other embodiments, a single region 1850 midway between sidewalls 1802 and 1804 replaces regions 1850, and a single cam, a tandem pair of cams, or a pair of resilient elements are located midway between sidewalls 1802 and 1804.

Figure 19:
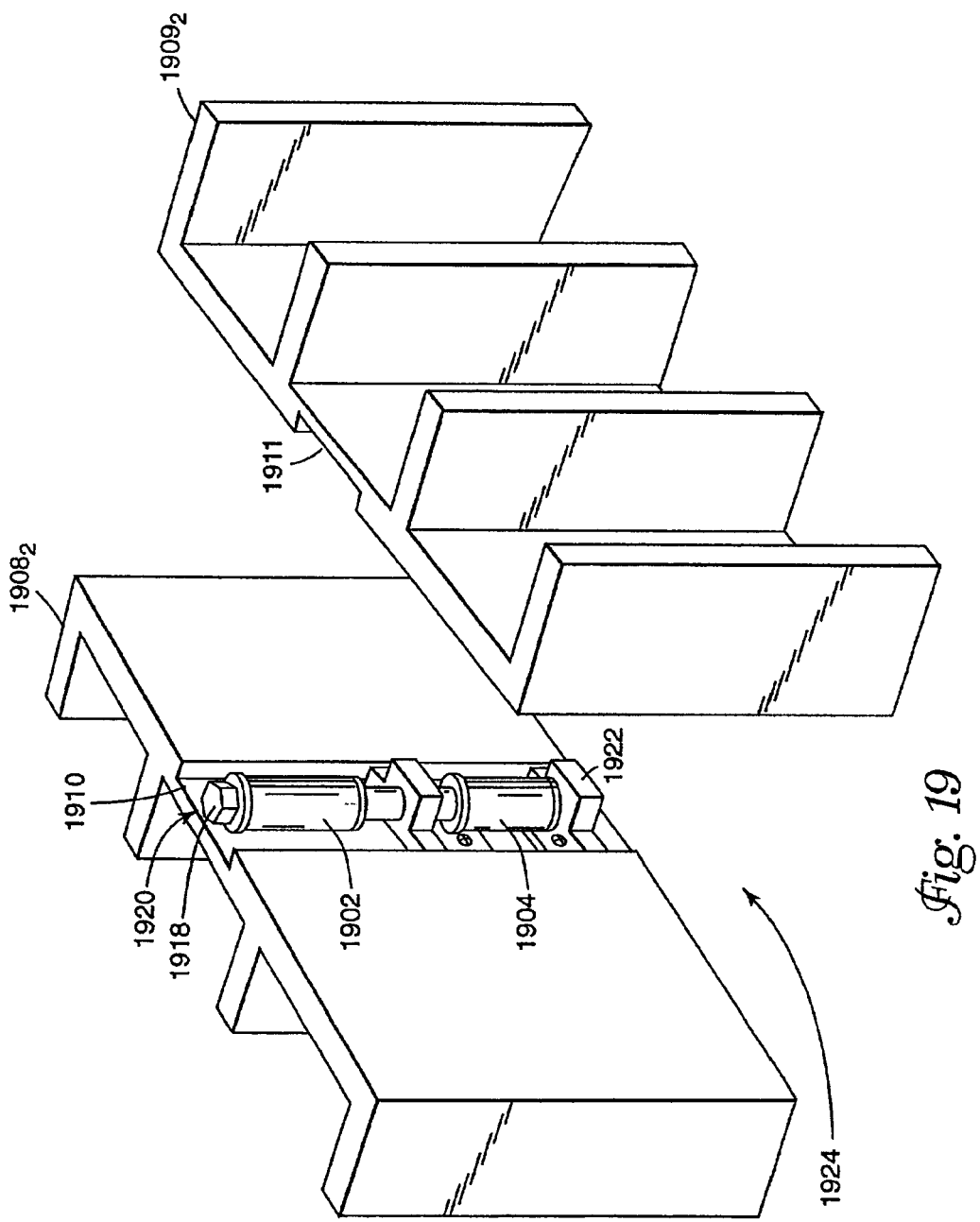
FIG. 19 is an exploded isometric view of an embodiment of a case of the present invention that has a pair of frames and that uses resilient elements for clamping several circuit cards within the frames.

In one embodiment, region 1875 of FIG. 18 is as shown in the exploded view of FIG. 19. In this embodiment, sub-frame portions $1908_2$ and $1909_2$ respectively replace the portions of sub-frames $1808_2$ and $1809_2$ contained within region 1875, and gap 1924 replaces gap 1824. Sub-frame portions $1908_2$ and $1909_2$ respectively have recesses 1910 and 1911, with the recess 1910 having resilient elements 1902 and 1904 disposed therein. In one embodiment, resilient elements 1902 and 1904 are as described above in conjunction with FIGS. 12–14.

Resilient elements 1902 and 1904 are compressed axially between head 1918 of shaft 1920 and nut 1922 when a torque is applied to head 1918 to thread shaft 1920 axially into nut 1922. This causes resilient elements 1902 and 1904 to bulge in generally the radial direction. As resilient elements 1902 and 1904 bulge generally radially, resilient elements 1902 and 1904 engage sub-frame portion $1909_2$ within recess 1911. When resilient elements 1902 and 1904 engage sub-frame portion $1909_2$, resilient elements 1902 and 1904 respectively exert a force on sub-frame portion $1909_2$ producing a reaction force that is exerted on sub-frame portion $1908_2$. In this way, a force is exerted on both sub-frame portions $1908_2$ and $1909_2$.

Figure 20:
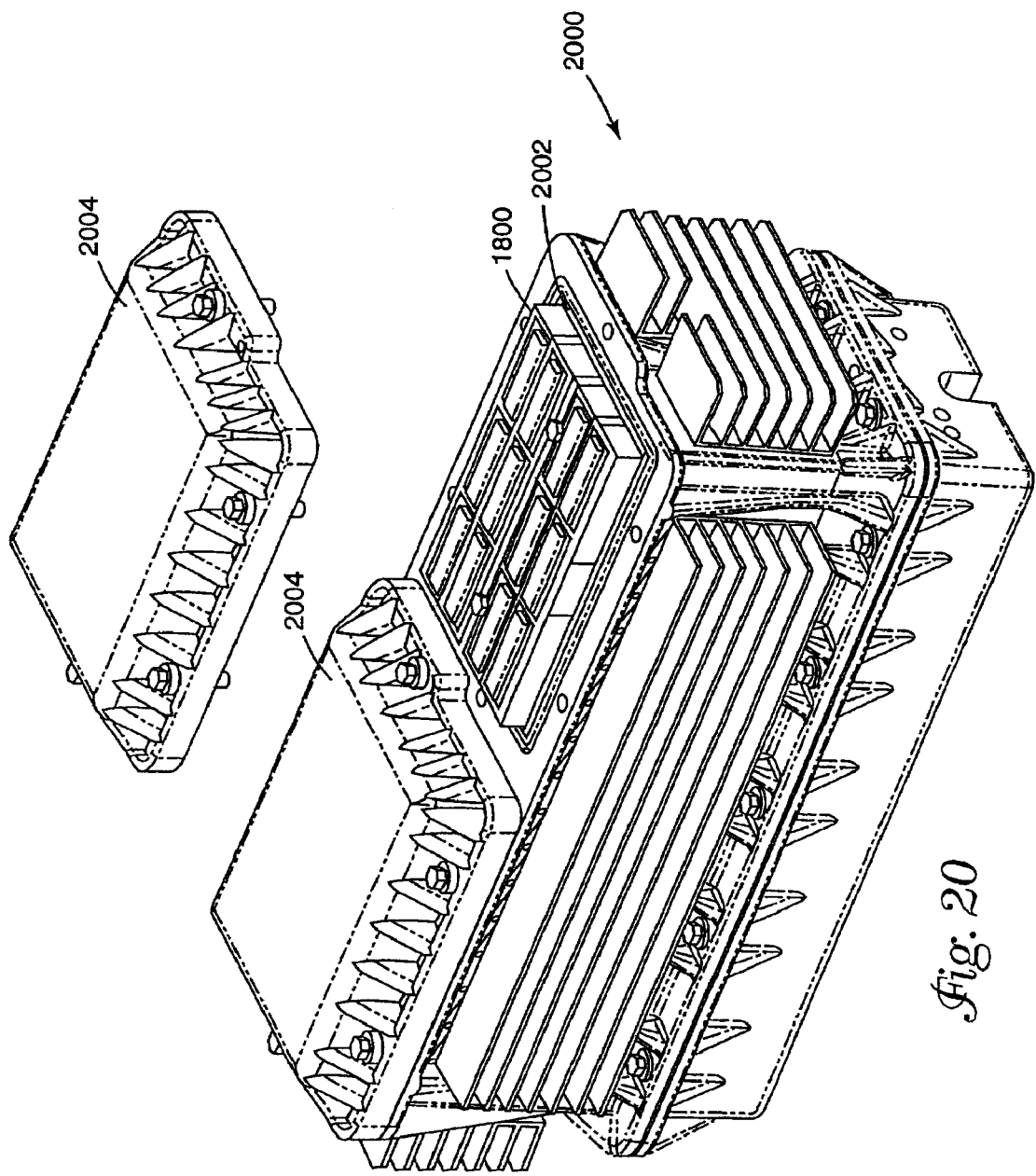
FIG. 20 is an isometric view illustrating an embodiment of a case positioned within a housing.

In one embodiment, a pair of cases 1800 is located within a housing, such as housing 2000 shown in FIG. 20. Housing 2000 has two compartments 2002 that are closed by covers 2004. Each of compartments 2002 receives a case 1800, as shown in FIG. 20, which, in one embodiment, is thermally coupled to housing 2000, as described in U.S. patent application Ser. No. 09/804,129, entitled MECHANICAL HOUSING, which application is incorporated herein by reference.

CONCLUSION

Embodiments of the present invention have been described. The embodiments provide cases that clamp circuit cards within them to improve the thermal contact between the circuit cards and the cases, thereby reducing the risk of thermal failure.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, although cam 810 is portrayed in the accompanying figures as being oval, cam 810 can also be circular, elliptical, or any suitable shape. Moreover, serrations 412, as shown in FIG. 10, can be eliminated from the curved surface of cam 810, or serrations 412 can be of a material other than rubber, such as plastic, metal, or the like. Although resilient elements 1202 and 1204 are shown to be hollow cylinders in FIG. 13, resilient elements 1202 and 1204 can have other geometries, such as cubes having apertures passing through them. Further, although cams 1611 are rotatably attached to end wall 1606, as shown in FIG. 16, and are rotatable into engagement with frame 1608, cams 1611 can be rotatably attached to frame 1608 and can be rotated into engagement with end wall 1606. Although cams 1825 are rotatably attached to frame 1808, as shown in FIG. 18, and are rotatable into engagement with frame 1809, cams 1825 can be rotatably attached to frame 1809 and can be rotatable into engagement with frame 1808.

What is claimed is:

1. A case for confining a first circuit card to a particular location within a housing, the case comprising:

a pair of opposing end walls;

a pair of opposing side walls coupled to the end walls;

wherein the pair of end walls and the side walls form a slot;

an actuator disposed within the slot, the actuator engageable with the first circuit card for clamping the first circuit card between the actuator and one of the pair of opposing end walls of the case;

a second circuit card; and a partition sandwiched between the first and second circuit cards; and wherein the actuator is engageable with one of the circuit cards.

2. The case of claim 1, wherein the actuator is a resilient element.

3. The case of claim 1, wherein the first circuit card is in slidable contact with the case.

4. The case of claim 1, wherein the case is thermally coupled to the housing.

5. The case of claim 1, wherein a heat sink is disposed between the case and the housing.

6. The case of claim 1, wherein the actuator is a cam.

7. The case of claim 1, wherein the actuator is a wedge.

8. The case of claim 1, wherein one of the pairs of end walls is in direct thermal contact with the first circuit card.

9. A case for confining a pair of circuit cards to different locations within a housing, the case comprising:

a pair of opposing side walls and first and second end walls;

a partition disposed between the first and second end walls that divides the case into a first slot bounded by a portion of each of the side walls, the partition, and the first end wall and a second slot bounded by another portion of each of the side walls, the partition, and the second end wall, the first and second slots each containing one of the circuit cards; and an actuator engageable with the circuit card in the first slot for clamping the circuit card in the first slot, the partition, and the circuit card in the second slot between the actuator and the second end wall.

10. The case of claim 9, wherein the actuator is a resilient element.

11. The case of claim 9, wherein the circuit cards are in slidable contact with each of the sidewalls.

12. The case of claim 9, wherein the partition is in slidable contact with each of the sidewalls.

13. The case of claim 9, wherein the second end wall is thermally coupled to the housing.

14. The case of claim 9, wherein a heat sink is disposed between the second end wall and the housing.

15. The case of claim 9, wherein the actuator is a cam.

16. The case of claim 9, wherein the actuator is a wedge.

* * * * *